United States Patent [19]

Chen et al.

[11] Patent Number: 5,545,289
[45] Date of Patent: Aug. 13, 1996

[54] PASSIVATING, STRIPPING AND CORROSION INHIBITION OF SEMICONDUCTOR SUBSTRATES

[75] Inventors: Jian Chen, Santa Clara; James S. Papanu, San Rafael; Steve S. Y. Mak, Pleasanton, all of Calif.; Carmel Ish-Shalom, Kiriat Motzkin, Israel; Peter Hsieh, Sunnyvale, Calif.; Wesley G. Lau, San Jose, Calif.; Charles S. Rhoades, Simi Valley, Calif.; Brian Shieh, Hualien, Taiwan; Ian S. Latchford, Sunnyvale, Calif.; Karen A. Williams, Santa Clara, Calif.; Victoria Yu-Wang, Los Altos, Calif.

[73] Assignee: Applied Materials, Inc., Santa Clara, Calif.

[21] Appl. No.: 268,377

[22] Filed: Jun. 29, 1994

Related U.S. Application Data

[63] Continuation-in-part of Ser. No. 191,828, Feb. 3, 1994.

[51] Int. Cl.$^6$ ............................................. H01L 21/00
[52] U.S. Cl. ........................... 156/643.1; 156/656.1; 156/659.11; 216/77
[58] Field of Search ................. 422/7, 9; 156/643.1, 156/656.1, 657.1, 659.11, 661.11, 662.1, 345 P; 216/67, 69, 77; 437/228

[56] References Cited

U.S. PATENT DOCUMENTS

| | | | |
|---|---|---|---|
| 2,323,369 | 7/1943 | Briggmann | 422/9 |
| 2,972,861 | 2/1961 | Davies | 422/9 |
| 3,967,926 | 7/1976 | Rozenfled et al. | 422/9 |
| 4,325,984 | 4/1982 | Galfo et al. | 204/164 X |
| 4,877,757 | 10/1989 | York et al. | 437/235 |
| 5,174,856 | 12/1992 | Hwang et al. | 156/643.1 |
| 5,200,031 | 4/1993 | Latchford et al. | 156/659.11 |
| 5,221,424 | 6/1993 | Rhoades | 156/643.1 |
| 5,328,555 | 7/1994 | Gupta | 156/643.1 |
| 5,384,009 | 1/1995 | Mak et al. | 156/643.1 X |
| 5,399,236 | 3/1995 | Ha et al. | 156/643.1 |

FOREIGN PATENT DOCUMENTS

| | | |
|---|---|---|
| 0539707 | 8/1955 | Canada . |
| 0515917 | 4/1957 | Canada . |
| 0304046 | 2/1989 | European Pat. Off. . |

(List continued on next page.)

OTHER PUBLICATIONS

Battey, J., "The Reduction of Photoresist Stripping Rates in an Oxygen Plasma by By-product Inhibition and Thermal Mass," *J. Electrochem. Soc.: Solid–State Science and Technology*, 124(1): 147–152 (Jan. 1977).

(List continued on next page.)

*Primary Examiner*—William Powell
*Attorney, Agent, or Firm*—Ashok K. Janah

[57] ABSTRACT

A process for passivating, and optionally stripping and inhibiting corrosion of an etched substrate (20), is described. In the process, a substrate (20) having etchant byproducts (24) thereon, is placed into a vacuum chamber (52), and passivated in a multicycle passivation process comprising at least two passivating steps. In each passivating step, passivating gas is introduced into the vacuum chamber (52) and a plasma is generated from the passivating gas. When the substrate also has remnant resist (26) thereon, the resist (26) is stripped in a multicycle passivation and stripping process, each cycle including a passivating step and a stripping step. The stripping step is performed by introducing a stripping gas into the vacuum chamber (52) and generating a plasma from the stripping gas. In the multicycle process, the passivating and optional stripping steps, are repeated at least once in the same order that the steps were done. Alternatively, the substrate (20) can also be passivated in a single cycle process using a passivating gas comprising water vapor, oxygen, and nitrogen. Optionally, corrosion of the substrate is further inhibited by introducing an amine vapor into the vacuum chamber (52) so that amine adsorps onto the substrate (20), forming a corrosion inhibition amine layer on the surface of the substrate (20).

91 Claims, 2 Drawing Sheets

FOREIGN PATENT DOCUMENTS

| | | |
|---|---|---|
| 0345757 | 12/1989 | European Pat. Off. . |
| 0379301 | 7/1990 | European Pat. Off. . |
| 0416774 | 3/1991 | European Pat. Off. . |
| 0489179 | 6/1992 | European Pat. Off. . |
| 63-070428 | 3/1988 | Japan . |
| 64-48421 | 2/1989 | Japan . |
| 1-112734 | 5/1989 | Japan . |
| 1-175231 | 7/1989 | Japan . |
| 3-41728 | 2/1991 | Japan . |
| 3-110843 | 5/1991 | Japan . |
| 4-171918 | 6/1992 | Japan . |
| 2008464 | 6/1979 | United Kingdom . |

OTHER PUBLICATIONS

Eldredge, G., et al., "Inhibitors of Corrosion of Aluminum," *Industrial and Engineering Chemistry*, 37(8):736–740 (Aug. 1945).

Fok, T., "Plasma Etching of Aluminum Films Using $CCl_4$," *Electrochemical Soc. Ext. Abstract*, May 1980, pp. 301–303.

Fujimura, S., et al., "Resist Stripping in an $O_2 + H_2O$ Plasma Downstream," *J. Vac. Sci. Technol. B*, 9(2):357–361 (Mar./Apr. 1991.).

Fujimura, S., et al., "Additive Nitrogen Effects on oxygen Plasma Downstream Ashing," *Japanese Journal of Applied Physics*, 29(10):2165–2170, Part 1, (Oct. 1990).

Kondo, T., et al., "Effects of $H_2O$ Downstream on After Corrosion," *1991 Dry Process Symposium*, pp. 117–122.

Mayumi, S., et al., "Post–Treatments for Reactive Ion Etching of Al–Si–Cu Alloys," *Journal of the Electrochemical Society*, 137(8):2534–2538 (Aug. 1990).

Nebergall, W., et al., "College Chemistry with Qualitative Analysis," *D.C. Heath and Company*, 6th Ed. (1980), p. 119.

Roebuck, A., et al., "Corrosion Inhibitors for Aluminum," *Materials Protection*, pp. 16–19 (Jul. 1966).

Rosenfeld, I., et al., "Mechanism of Metal Protection by Volatile Inhibitors," *Corrosion*, 20(7):222t–234t (Jul. 1964).

Wranglin, G., "An Introduction to Corrosion and Protection of Metals," *Chapman and Hall* (1985), pp. 165–173.

PASSIVATING, STRIPPING AND CORROSION INHIBITION OF SEMICONDUCTOR SUBSTRATES

CROSS-REFERENCE

This application is a continuation-in-part of U.S. patent application Ser. No. 08/191,828, by Charles S. Rhoades, et al., filed on Feb. 3, 1994, which is incorporated herein by reference.

BACKGROUND

This invention relates to a process for passivating and stripping semiconductor substrates.

Electrically conductive features comprising metal-containing compounds are formed on semiconductor substrates to electrically connect the devices formed on the substrate. Typically, the features are formed by the steps of (i) depositing continuous layers of metal-containing compounds and alloys on the substrate, (ii) overlaying a patterned, protective, resist material on the metal-containing layers, and (iii) etching the unprotected portions of the metal-containing layer to form features underlying the resist protected portions of the metal-containing layer. The metal-containing layers are deposited on the substrate using conventional chemical and physical vapor deposition techniques, and comprise metals conventionally used in the formation of integrated circuits, such as for example, aluminum, titanium and tungsten. A patterned resist layer, such as oxide hard mask or polymeric resist, is formed on the deposited metal-containing layers, using conventional photoresist and photolithographic techniques. After the oxide hard mask or patterned resist layer is formed, conventional reactive ion etching processes using halogen-containing etchants, such as for example. $Cl_2$, $BCl_3$, $CCl_4$, $SiCl_4$, $CF_4CF_4$, $NF_3$, $SF_6$, and mixtures thereof, are used to etch the metal-containing layers, as generally described in S. Wolf and R. N. Tauber, *Silicon Processing for the VLSI Era*, vol. I, Chap. 16: Dry Etching for VLSI, Lattice Press, Sunset Beach, Calif. (1986), which is incorporated herein by reference.

The reactive ion etching processes leave (i) corrosive etchant byproducts, (ii) remnant resist, and (iii) sidewall deposits on the sidewalls of the etched features. The etchant byproducts result from adsorption of the halogen-containing etchants on the etched features. Remnant resist are those residual resist portions that are not etched by the etchant gases, and which remain on the substrate after the etching process. The sidewall deposits are formed during the etching process, by reaction of the etchant gases, the metal-containing layers, and the resist; and condensation of the reaction byproducts on the sidewalls of the features.

The remnant resist, etchant byproducts, and sidewall deposits on the substrate are removed by stripping, passivating, and wet chemical etching methods. Conventional stripping methods which use a plasma of oxygen, and an oxygen activating gas such as $CF_4$ or $N_2$, can be used to strip polymeric remnant resist from the substrate. These conventional stripping techniques are sometimes ineffective at stripping all the resist from the substrate, particularly when the polymeric resist is hardened by exposure to a plasma. For oxide hard mask resists, the oxide layer can be stripped or can be left on the substrate. Typically, remnant oxide hard mask is left on the substrate and a dielectric layer is deposited on the remnant oxide in a subsequent process step.

Passivating and inhibition techniques are used to reduce post-etch corrosion problems. After etching, the substrate is exposed to ambient moisture in the atmosphere, and the etchant byproducts on the substrate react with absorbed moisture to form corrosive species which corrode the etched features on the substrate. For example, when chlorine-containing gases are used to etch aluminum features on the substrate, chlorine-containing residues such as hygroscopic $AlCl_3$ form on the features. The chlorine residues react with adsorped moisture from the atmosphere to form hydrochloric acid which corrodes the aluminum features. The corrosion problem is particularly severe for alloys such as Al-Cu alloy and Ti-W alloy, because galvanic coupling of the metals in these alloys results in corrosion of the alloys even at trace levels of residual chlorine and low levels of ambient moisture.

In passivating techniques, the etchant byproducts on the substrate are inactivated using a passivating gas. For example, a passivating method useful for passivating chlorine etchant byproducts on aluminum-containing features comprises exposing the etchant byproducts to a $CF_4$ plasma. It is believed that some of the chlorine ions on the features are replaced by the fluorine ions in the $CF_4$ plasma to form non-hydroscopic species, such as $AlF_3$. Corrosion of the passivated substrate is reduced because the non-hydroscopic species does not corrode the features.

In corrosion inhibition techniques, a corrosion inhibiting deposit is formed on the surfaces of the metal-containing features. One inhibition method comprises exposing the substrate to a $CHF_3$ plasma. It is believed that the $CHF_3$ exposure causes a sidewall film to deposit on the features, thus "sealing" the surface of the features with a corrosion inhibiting layer that prevents ambient moisture from contacting the substrate.

After passivating and stripping, the sidewall deposits on the sidewalls of the features on the substrate are removed by applying a wet chemical etchant solution, such as an acidic solution, to the substrate. The chemical etchant solution dissolves the sidewall deposit on the substrate.

Conventional passivating and inhibition techniques have several limitations. One limitation is that the conventional techniques which have acceptable process throughput, can prevent post-etch corrosion of the substrate only for short periods, typically ranging from about 1–5 hours after exposure of the substrate to ambient moisture. The short corrosion resistant period is undesirable because it necessitates that post-etch processing steps be performed within 1-to-2 hours after the substrate is first exposed to the atmosphere, resulting in a tight and inflexible production schedule. Often, the substrate cannot be etched, or if already etched, cannot be removed from the passivating and stripping chamber, until the next processing station is available. This precludes efficient use of the etching and passivating equipment. Also, unexpected processing delays, such as that caused by equipment failures can cause the loss of an entire batch of wafers. Cumulative manufacturing losses can exceed tens of millions of dollars.

Even longer corrosion resistant periods, typically at least about one week, are desirable after wet chemical etching of the substrate. The extended corrosion resistance period is desirable so that the partially processed substrate can be stored while waiting for the next processing step. Conventional passivating processes are typically unable to provide these extended corrosion resistant periods.

The short corrosion resistant period provided by conventional processes, results from their inability to remove all of the etchant byproducts on the metal features. Trace amounts of residual etchant byproducts left on the substrate cause delayed post-etch corrosion of the substrate. Conventional passivating processes can provide increased substrate corrosion resistance, when they are performed on the substrate for an extended duration of time. However, the extended duration passivation processes are commercially unacceptable, because they provide reduced process throughput.

Thus, there is a need for a passivating process that effectively passivates the etchant byproducts on the substrate so that the substrate exhibits substantially no post-etch corrosion for an extended period of time. There is also a need for a stripping process that can strip substantially all of the polymeric remnant resist portions remaining on the substrate. It is also be highly desirable to have a passivating and/or stripping process that is faster than conventional processes and provides high process throughput. It is also desirable to use conventional processing equipment to passivate and strip the substrate.

SUMMARY

The process of the present invention satisfies these needs by providing a passivating, and optionally stripping, process that is fast and provides improved substrate corrosion resistance. In the process, an etched substrate with etchant byproducts thereon, is placed in a vacuum chamber and passivated in a multicycle process comprising at least two passivating steps. In each passivating step, a passivating gas is introduced into the vacuum chamber and a plasma is formed from the passivating gas to passivate the etchant byproducts.

When there is remnant resist on the substrate, a preferred process comprises a multicycle passivation and stripping process. Each cycle of the multicycle process includes a passivating step and a stripping step. In the stripping step, remnant resist is stripped from the substrate by introducing stripping gas into the vacuum chamber and forming a plasma from the stripping gas. In the passivating step, passivating gas is introduced into the vacuum chamber and a plasma is formed from the passivating gas to passivate the etchant byproducts. The stripping and passivating steps are repeated at least once in the same order that the steps were done originally, to yield the multicycle passivating and stripping process. In each cycle, the passivating step can be performed before the stripping step, or vice versa, however, it is preferred to end the process with a stripping step. A substrate processed in this multicycle process typically exhibits no post-etch corrosion for at least 24 hours, and more typically exhibits no corrosion for at least 3 days.

The multicycle passivation, and optional stripping processes, preferably comprise from 1 to 10 cycles, and more preferably comprise from 2 to 5 cycles. Preferred passivating gases comprise (i) ammonia and oxygen, or (ii) water vapor, with optionally oxygen and nitrogen. Preferred stripping gases comprises (i) oxygen, and (ii) an oxygen activating gas, such as $CF_4$ or $N_2$.

An alternative process, comprising a single cycle passivating and stripping process can also provide improved corrosion resistance. In this process, either the passivating gas or the stripping gas, or both, can comprise a plasma of water vapor, oxygen, and nitrogen. Depending on the ratio of the volumetric flow of water vapor ($V_{H2O}$) to the combined volumetric flow of oxygen and nitrogen ($V_{O2}+V_{N2}$) in the process gas, the process gas can have primarily a passivating function, or primarily a stripping function. When the $V_{H2O}:(V_{O2}+V_{N2})$ ratio in the process gas is from about 1:2 to about 2:1, the process gas functions primarily as a passivating gas. When the $V_{H2O}:(V_{O2}+V_{N2})$ ratio in the process gas is from about 1:4 to about 1:40, the process gas functions primarily as a stripping gas.

After the passivating and optional stripping processes, corrosion of the substrate can be further suppressed by forming an adsorbed amine-containing inhibiting layer on the substrate. The amine inhibition step is performed by introducing amine vapor into the vacuum chamber so that the amine vapor is adsorbed onto the substrate. The amine used in the process comprises $(R_x)_3$—N, where at least one $R_x$ is an alkyl moiety, and the other $R_x$ are independently selected from the group consisting of hydrogen and alkyl moieties. The vapor pressure of the amine is sufficiently high that at least a portion of the amine is gaseous in the vacuum chamber, and sufficiently low that at least a portion of the amine is adsorbed onto the substrate.

DRAWINGS

These and other features, aspects, and advantages of the present invention will be better understood from the following drawings, description and appended claims, where:

DESCRIPTION

Figure 1A:
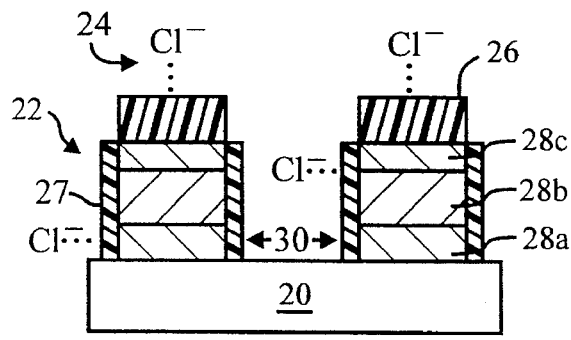
FIG. 1a is a schematic view in vertical cross-section of a substrate with etched metal-containing features, showing etchant byproducts, remnant resist, and sidewall deposits thereon.
Figure 1B:
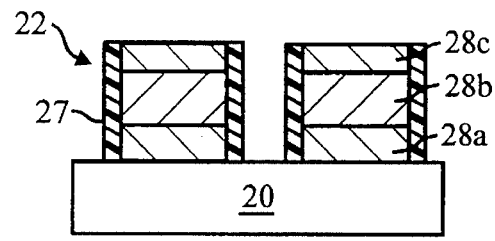
FIG. 1b is a schematic view in vertical cross-section of the substrate of FIG. 1a after passivating and stripping showing removal of the etchant byproducts and remnant resist.
Figure 1C:
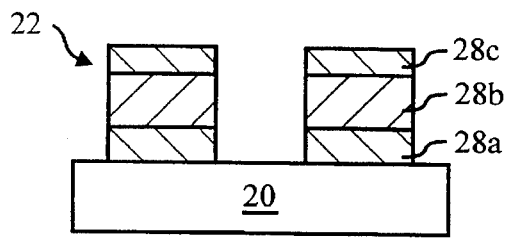
FIG. 1c is a schematic view in vertical cross-section of the substrate of FIG. 1b after removal of the sidewall deposits.
Figure 1D:
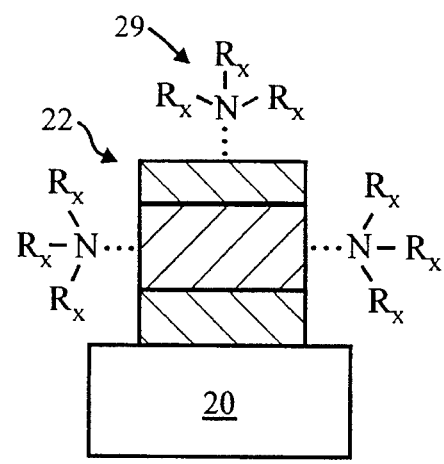
FIG. 1d is a schematic view in vertical cross-section of the substrate of FIG. 1c, after inhibition of the substrate with amines, showing amines adsorbed on the substrate.

The process of the present invention is performed on a partially processed substrate 20 after etching of the substrate. The substrate 20 has etched metal-containing features 22 with (i) etchant byproducts 24, (ii) remnant resist 26, and (iii) sidewall deposits 27 on the sidewalls of the features 22, as schematically shown in FIG. 1a.

The substrate 20 typically comprises a semiconducting material, such as silicon, gallium arsenide, and the like. The metal-containing features 22 on the substrate 20 can comprise any metal conventionally used in the formation of integrated circuits, such as for example, aluminum, titanium and tungsten. Typically, the metal-containing features 22 comprise a plurality of layers 28, such as for example, (i) a diffusion barrier layer 28a, such as titanium, tungsten, titanium-tungsten or titanium nitride; (ii) an electrically conductive layer 28b comprising aluminum or alloys of aluminum, copper, and optionally silicon; and (iii) an antireflective layer 28c, comprising silicon, titanium nitride or titanium-tungsten. The width of the features 22 is typically from about 0.3 to about 10 microns, and the spacing 30 between the features 22 typically ranges from about 0.3 microns to about 10 microns.

The etchant byproducts 24 on the features 22 typically comprise residual halogen radicals, such as chlorine or fluorine, that remain on the substrate after etching of the metal-containing features 22. The etchant byproducts 24 can also comprise byproduct compounds that are formed when residual halogen radicals react with the metal in the features 22.

The remnant resist 26 comprises any protective material that is used to prevent etching of the metal containing layers deposited on the substrate. The remnant resist 26 are those portions of the resist that remain on the substrate after the etching process. Typically, the remnant resist 26 comprises residual polymeric photoresist or oxide hard mask. Suitable polymeric photoresist materials are commercially available from vendors such as Shipley Co., Marlboro, Mass., or Tokyo Ohka Kogyo (TOK) Co., Ltd., Kawasaki, Japan.

The sidewall deposits 27 on the sidewalls of the features 22, are typically formed during the etching process used to etch the features 22. The sidewall deposits 27 typically comprise organic compounds containing (i) carbon and hydrogen, (ii) metal from the metal-containing layers, such as aluminum, and (iii) etchant gas species such as boron and nitrogen. The composition and stoichiometry of the sidewall deposits 27 depend upon the chemical composition of the metal-containing layers, the resist, and the etchant gases used to etch the features 22.

The etchant byproducts 24, remnant resist 26 and sidewall deposits 27 that remain on the features 22 after etching are removed or inactivated by passivating, stripping, and wet chemical etching processes. In the passivating process, substantially all the etchant byproducts 24 on the substrate 20 are passivated using a passivating gas plasma. In the stripping process, substantially all the remnant resist 26 is stripped using a stripping gas plasma. Optionally, after passivating and stripping, corrosion of the substrate 20 can be further inhibited by adsorping amine onto the substrate 20 in an amine inhibition step. A wet chemical etching process is used to remove the sidewall deposits 27 on the features 22. Each of these processes, and an apparatus suitable for performing these processes, is described below.

Figure 2:
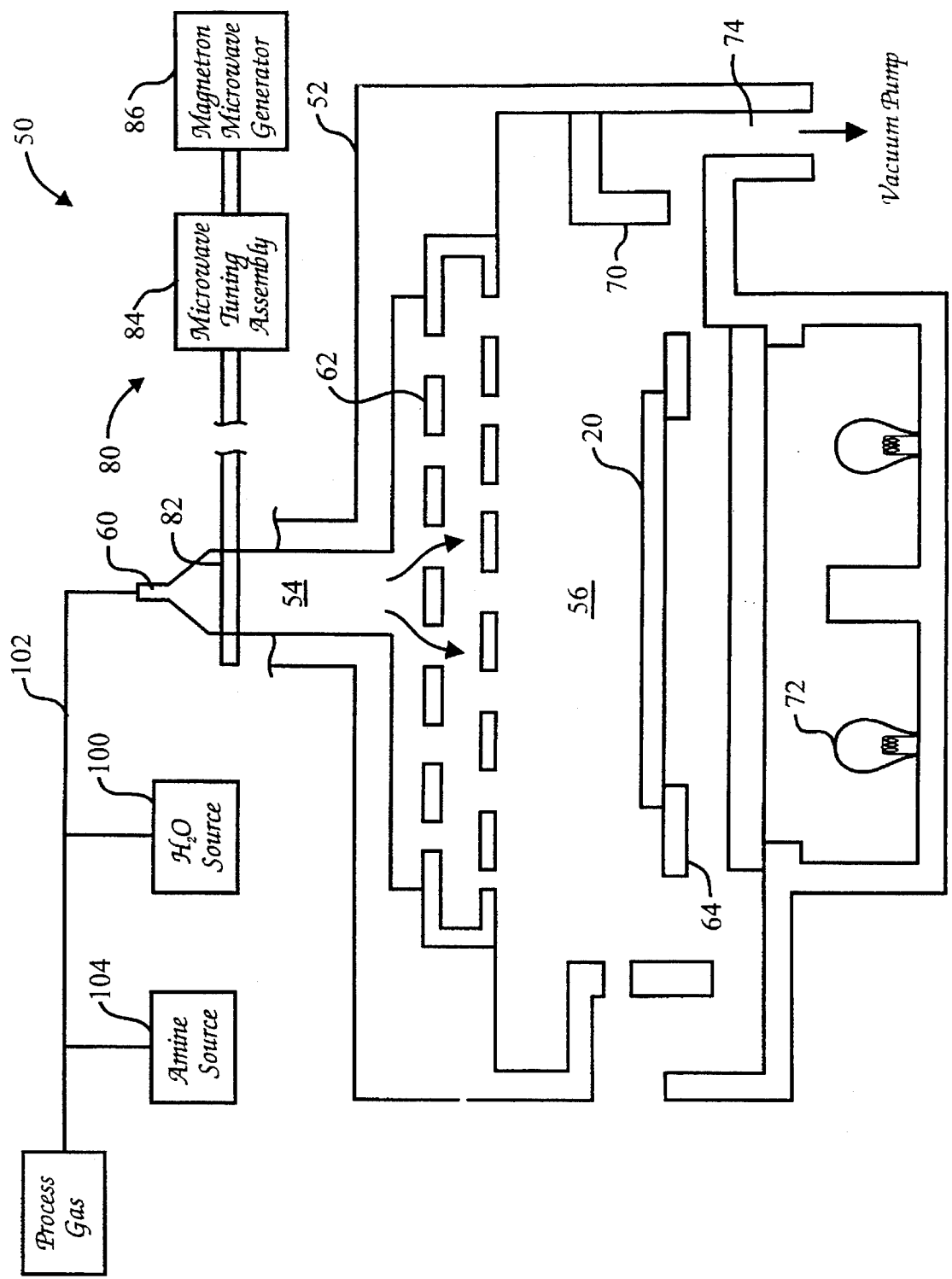
FIG. 2 is a schematic view in vertical cross-section of a vacuum chamber suitable for practicing the process of the present invention.

An apparatus 50 suitable for performing the process of the present invention is schematically shown in FIG. 2. The apparatus 50 comprises an etch chamber (not shown) connected by a load-lock transfer area (also not shown) to a vacuum chamber 52 suitable for performing passivating, stripping, and optional inhibiting processes. The load-lock transfer area is maintained in vacuum, so that after etching in the etching chamber, the etched substrate 20 can be transferred from the etch chamber to the vacuum chamber 52, without exposure to ambient moisture in the atmosphere.

The vacuum chamber 52 has a plasma generation zone 54 and a vacuum zone 56. Process gases enter the vacuum chamber 52 through a gas inlet 60, and are uniformly distributed in the vacuum zone 56 by "showerhead" type diffuser 62. A substrate support 64 which can comprise a "basket" hoop support (as shown), or a pedestal (not shown), is provided for holding the substrate 20 in the vacuum chamber, and a focus ring 70 maintains the process gas flow around the substrate 20. A heat source, such as infrared lamps 72, can be used to heat the substrate 20. Gaseous byproducts and spent process gas are exhausted from the vacuum chamber 52 through an exhaust 74 which is in fluid communication with an exhaust system (not shown) and throttle valve (not shown) capable of maintaining a pressure of at least about 1 mTorr in the vacuum chamber 52.

A microwave plasma generator assembly 80 connected to the plasma generation zone 54 of the apparatus 50 can be used to generate a plasma from the process gas. A suitable microwave generator assembly 80 is an "ASTEX" Microwave Plasma Generator commercially available from the Applied Science & Technology, Inc., Woburn, Mass. Typically, the microwave generator assembly 80 comprises a microwave applicator 82, a microwave tuning assembly 84, and a magnetron microwave generator 86. Alternative plasma generating sources, such as RF-generated plasmas, inductive coupled plasmas, and the like, can also be effective.

Multicycle Process

To perform the passivating, and optional stripping process, an etched substrate 20 is transferred to a vacuum chamber 52 which is maintained at suitable process conditions. The substrate is processed in a multicycle process comprising (i) multiple passivating steps, or (ii) multiple passivating and polymeric resist stripping steps, or (iii) multiple passivating and oxide mask resist stripping steps. Alternatively, a single cycle process which utilizes water vapor to passivate the substrate can also be used, as described below.

Multicycle Passivation Process

A preferred process is a multicycle passivation process having multiple passivating steps, including at least two passivating steps. The multicycle passivation process is desirable when there are only etchant byproducts on the substrate, or when it is desirable to strip the substrate in a separate stripping step. In the first cycle, passivating gas is introduced into the chamber 52 and plasma is generated from the passivating gas. Thereafter, the flow of passivating gas is stopped, and the plasma in the chamber is extinguished. In the second passivating cycle, passivating gas is again introduced into the chamber, and plasma is again generated in the chamber. In this manner, multiple passivating cycles are used to passivate the substrate 20.

In the first step of each passivating cycle, a passivating gas is introduced into the vacuum chamber 52 and a plasma is formed from the passivating gas. The plasma activated passivating gas reacts with the etchant byproducts 24 on the substrate 20 to form gaseous byproducts which are exhausted from the vacuum chamber 52. For example, when the etchant byproducts 24 comprise chlorine, and the passivating gas contains a hydrogen-containing gas, the plasma activated hydrogen radicals react with the chlorine to form species such as hydrochloric acid vapor, which are exhausted from the chamber 52.

The pressure in the vacuum chamber 52 can be varied between the successive steps of each passivating cycle or can be maintained constant. Typically, during the first step, when process gas is introduced into chamber, the chamber 52 is maintained at a first higher pressure of about 1 to 100 Torr, more preferably from about 1 to about 10 Torr, and most preferably at about 2 Torr. Optionally, the pressure in the chamber 52 is reduced to a second lower pressure, after the flow of passivating gas is stopped and the plasma is extinguished. Typically, the second lower pressure is less than 1 Torr, more typically less than 500 mTorr, and most typically less than 100 mTorr.

Any gas or vapor containing hydrogen can serve as the passivating gas, including hydrogen, water vapor, ammonia, methanol, hydrogen sulfide, and mixtures thereof. Preferred passivating gases include (i) ammonia and oxygen, or (ii) water vapor, with optional oxygen and nitrogen. When the passivating gas comprises ammonia and oxygen, the volumetric flow ratio of ammonia to oxygen is preferably from about 1:1 to about 1:50, more preferably from about 1:5 to about 1:20, and most preferably about 1:10. For a 5-liter capacity chamber 52, a preferred gas flow comprises 300 sccm $NH_3$ and 3000 sccm $O_2$.

Alternatively, a passivating gas comprising only water vapor can be used to passivate the etchant byproducts 24. When the vacuum chamber 52 has a five-liter capacity, the water vapor flow rate is preferably from about 100 to 1000 sccm, and more preferably about 500 sccm. The water vapor is formed in a boiler or bubbler 100 containing water which is connected to the vacuum chamber 52 by the feedline 102. The boiler or bubbler is maintained at a sufficiently high temperature and at a sufficiently low pressure to vaporize the water. When a boiler is used, the water in the boiler is heated to a temperature close to the boiling point of water. Typically, the pressure in the boiler ranges from about 50 Torr to about 200 Torr, and more typically ranges from about 100 Torr to about 150 Torr. When a bubbler is used, an inert carrier gas such as argon or helium can be passed through the bubbler to transport water vapor to the vacuum chamber 52.

Optionally, oxygen and nitrogen can be added to the water vapor to enhance passivating. The effect of the oxygen and nitrogen addition depends on the ratio of the volumetric flow of water vapor ($V_{H2O}$) to the combined volumetric flow of oxygen and nitrogen ($V_{O2}+V_{N2}$). A suitable volumetric ratio of water vapor flow $V_{H2O}$ to combined volumetric flow of oxygen and nitrogen ($V_{O2}+V_{N2}$) for use as a passivating gas is from about 1:2 to about 2:1, and more preferably about 1:1.

Multicycle Passivation & Stripping Process

More typically, it is desirable to strip remnant resist and remove etchant byproducts from the substrate using a multicycle process comprising multiple stripping and passivating steps. In each passivating step, passivating gas is introduced into the chamber 52 and plasma is generated from the passivating gas to passivate the substrate 20. The passivating step is performed using the gas compositions described above. In each stripping step, stripping gas is introduced into the chamber, and a plasma is generated from the stripping gas to strip the substrate 20. In the stripping step, either the polymeric resist or the oxide hard mask on the substrate, is stripped from the substrate, and the process conditions and composition of the stripping gas vary accordingly. The stripping and passivating steps are repeated at least once, preferably in the same order that steps were originally done to yield the multicycle process. In the process, the passivating step can be performed before the stripping step, or vice versa. Typically, a stabilization step is performed between each process step, during which the process conditions for the successive step are stabilized.

The pressure of the vacuum chamber 52 can be varied between successive passivating or stripping steps, or can be varied between successive cycles, or can be maintained substantially constant. Preferably, the change in pressure between successive steps is minimized to increase process throughput efficiency. During the passivating and stripping steps, the vacuum chamber 52 is preferably maintained at a pressure ranging from about 1 to about 100 Torr, more preferably from about 1 to about 10 Torr, and most preferably at about 2 Torr.

The stripping step is used to strip the protective layer of resist remaining on the substrate. In the stripping step, stripping gas is introduced into the vacuum chamber 52, and a plasma is formed from the stripping gas. The process conditions and gas compositions that are used in the stripping step depend on the composition of the remnant resist remaining on the substrate. Typically, the remnant resist is either a polymer or oxide hard mask, and the stripping gases for each of these is discussed below.

Polymeric remnant resist can be stripped using conventional resist stripping processes, such as those described in U.S. Pat. Nos. 5,221,424, to Rhoades, and 5,174,856 to Hwang, et al., both of which are incorporated herein by reference. A suitable stripping gas for stripping the polymeric resist comprises (i) oxygen, and (ii) an oxygen activating gas or vapor, such as water vapor, nitrogen gas, or fluorocarbon gas, the fluorocarbon gases including $CF_4$, $C_2F_6$, $CHF_3$, $C_3H_2F_6$, and $C_2H_4F_2$. The oxygen activating gas increases the concentration of oxygen radicals in the stripping gas. A preferred stripping gas composition comprises oxygen and nitrogen in a volumetric flow ratio of about 6:1 to about 200:1, and more preferably from about 10:1 to about 12:1. For a 5-liter vacuum chamber 52, a suitable gas flow rate comprises 3000 to 3500 sccm of $O_2$ and 300 sccm of $N_2$.

An alternate stripping gas suitable for stripping polymeric resist comprises water vapor, oxygen and nitrogen. To provide adequate stripping rates, the water vapor content in the stripping gas should be less than about 20% by volume of the combined oxygen and nitrogen gas content. A suitable ratio of the volumetric water vapor flow $V_{H2O}$ to the combined volumetric flow of oxygen and nitrogen ($V_{O2}+V_{N2}$) is from about 1:4 to about 1:40, and more preferably about 1:10. It is believed that the water vapor addition results in passivating of some of the etchant byproducts. Thus, this gas mixture allows simultaneous stripping and passivating of the substrate.

When the remnant resist comprises oxide hard mask, suitable stripping gases are gases capable of stripping oxide, such as halogen containing gases, including $CF_4$, $C_2F_6$, $CHF_3$, $C_3H_2F_6$, $C_2H_4F_2$ and HF. Other halogen gases, such as $BCl_3$, $CCl_4$, or $SiCl_4$, can also be used to facilitate removal of sidewall deposits, however, when chlorine containing gases are used, the oxide stripping process should be performed in the etching chamber (not shown) of the apparatus 50, to prevent contamination of the passivation chamber with chlorine gas. Typically, only a portion of the oxide hard mask is stripped during the stripping step, and a subsequent process step is used to deposit a dielectric or insulative layer on the substrate.

Temperature and Plasma

The temperature of the substrate can also be varied or maintained constant, during successive passivating or stripping processes. Preferably, the change in temperature between successive process steps is maintained constant for process efficiency. Typically, the substrate 20 is maintained at a temperature of from about 150° C. to about 400° C., and more preferably from about 200° C. to 380° C. The substrate is heated using the lamp heaters 72.

A plasma is formed from the stripping or passivating gas using the microwave plasma generator 80 of the apparatus 50. When the plasma causes the substrate 20 to heat up, the power level of the microwave generator 80 is regulated so that the temperature of the substrate remains substantially constant. Typically, the power output of the microwave generator 80 ranges from 500 to 2500 Watts, and more preferably from 800 to 1500 Watts.

Cycles

The multicycle processes are performed for multiple cycles, each cycle comprising a passivating step, and optionally, a stripping step. Generally, the greater the number of cycles used in the multicycle processes, the higher the corrosion resistance of the processed substrate 20. Processes having more numerous process cycles provide higher corrosion resistance than processes with fewer cycles, even though the total or cumulative duration of the passivating and stripping steps in the processes is the same. However, a smaller number of cycles provides faster process throughput, particularly when the duration of the stabilization period between each process step is long. The sum of the stabilization periods result in a process which is too long in duration. Thus, the number of cycles is preferably from about 2 to about 10 cycles, and more preferably from about 2 to about 5 cycles.

Preferably, the passivating step, and optional stripping step, within each process cycle has a duration ranging from about 1 to about 60 seconds, more preferably from about 2 to about 30 seconds, and most preferably from about 2 to about 20 seconds. These cycle durations have been found to yield effective passivating and stripping processes. In the multicycle passivating and stripping processes, the passivating step within each cycle has typically the same duration as the stripping step within each cycle, however, these steps can also have different durations.

Advantages

The multicycle passivation, and optional stripping processes can provide faster process throughput and superior corrosion resistance than prior art processes. The ability to achieve corrosion resistance equivalent or superior to that obtained using single cycle processes, in a shorter duration process, is an unexpected commercial advantage of the multicycle process.

It is believed the multicycle passivating process can provide fast throughput because it allows faster etchant byproduct removal arising from faster diffusion mechanisms. In the first passivation step, etchant byproducts 24 are removed from the surface of the substrate 20. Thereafter, passivate species must diffuse into the remnant resist (24), and sidewall deposition (27) to react with the etchant byproducts 24, and the reaction products must diffuse back out to the surface and desorb. For multicycle passivation when the flow of passivating gas is stopped, and optionally, when the pressure in the vacuum chamber is lowered, more rapid desorption of passivating byproducts should occur. The sequential depletion and diffusion process allows faster and more effective passivation of the etchant byproducts 24.

The multicycle passivating and stripping processes have been demonstrated to provide faster throughput, and superior corrosion resistance than prior art processes. For multicycle passivation and step processes, the stripping steps remove remnant resist 26 and remove selective constituents of the resist 26 or sidewall deposits 27. The stripping step can make the remnant resist 26 and the sidewall deposits 27 thinner and more porous. Thus, the multiple stripping and passivation process enhances both diffusion of passivating species into the remnant resist 26 and diffusion of passivating reaction products such as HCl out of the resist 26.

Another important advantage of the multicycle process is the ability to obtain a substrate that is resistant to corrosion by ambient moisture for at least 24 hours, and more typically at least 48 hours, after passivation of the substrate. This is a substantial improvement over prior art processes, which typically provide corrosion resistance for only about 1 to 2 hours. The improved corrosion resistance allows more efficient processing schedules and reduces manufacturing losses.

Single Cycle Passivating and Stripping Process

Instead of the multicycle passivating and stripping process, a water vapor based single cycle passivating and stripping process can also be used to passivate and strip the substrate 20. In this process, the stripping process is performed as a separate step carried out before or after the passivating step. Either the passivating or the stripping step is performed using a process gas comprising water vapor, oxygen and nitrogen. The volumetric flow ratio and process conditions generally described above are suitable, with the exception that the duration of the stripping and passivating step is increased to from about 20 seconds to about 4 minutes, and more preferably from about 10 seconds to about 60 seconds. Overall, the single cycle process is more suitable for substrates which are less susceptible to corrosion, or when process throughput is of less concern.

Amine Inhibition

After the passivating, and optional stripping processes, the corrosion of the substrate 20 can be optionally further suppressed by forming an amine-containing inhibiting layer 29 on the surface of the etched metal features 22 of the substrate 20. It is believed that in the amine inhibition step, the amine forms a passivating layer adsorbed on the surface of the features that serves to inhibit corrosion of the features. The amine inhibition layer is not required for most metal features 22, because the above described passivating and stripping processes provide adequate corrosion resistance. However, the amine layer can be useful for features 22 containing metal alloys that exhibit high galvanic coupling activity, to prevent corrosion of these metals.

The amine inhibition step is effected in the same vacuum chamber 52, after completion of stripping and passivating process. In this step, amine vapor is introduced into the vacuum zone 56 of the vacuum chamber 52 for a sufficient time to adsorb sufficient amine on the substrate 20 to inhibit corrosion of the substrate 20 for at least about 24 hours when the substrate 20 is exposed to the atmosphere. Generally, during this 24-hour period, the substrate 20 undergoes additional processing steps which eliminate the necessity for inhibiting corrosion of the substrate 20. The longer the substrate 20 is exposed to the amine the more effective is the corrosion inhibition. However, for process throughput efficiency, the amine is exposed to the substrate 20 for less than about 120 seconds, more preferably for less than about 90 seconds, and most preferably for less than about 60 seconds.

During the amine exposure step, the vacuum zone 56 is preferably maintained at a pressure ranging from about 1 Torr to about 100 Torr, and more preferably ranging from about 1 Torr to about 10 Torr.

Amines useful in the present process comprise $(R_x)_3$—N, where at least one $R_x$ is an alkyl moiety, and where the other $R_x$ are independently selected from the group consisting of hydrogen and alkyl moieties. The alkyl moieties preferably comprise alkyls, such as methyl, ethyl and propyl, and each alkyl preferably comprises from 1 to 5 carbon atoms. Suitable amines include mono-alkyl, di-alkyl and tri-alkyl substituted methylamines, ethylamines, propylamines, and the like.

Preferably, the amine comprises at least two alkyl moieties, and more preferably three alkyl moieties. It is believed that amines are effective inhibitors because the unbonded electron pair on the nitrogen atom can easily form coordinate covalent bonds with the metal-containing features 22. The ease of bonding of the nitrogen electron pair with the metal of the features 22, increases with the degree of alkyl substitution in the amine. Thus, it is believed that the tertiary (trialkyl) amines are more effective inhibitors than the secondary (dialkyl) amines, which in turn, are more effective inhibitors than the primary (monoalkyl) amines. However, the toxicity and commercial availability of the amines may also control selection of an appropriate amine.

Selection of an amine having an appropriate vapor pressure is also important to adsorb amine 29 onto the substrate 20. The vapor pressure of the amine is sufficiently high that at least a portion of the amine is gaseous in the vacuum chamber 52 and sufficiently low that at least a portion of the amine is adsorbed onto the substrate 20 in the vacuum chamber 52. Thus, preferably, the amines are mono-alkyl, di-alkyl and tri-alkyl substituted methylamines and ethylamines, such as monomethylamine, dimethylamine and trimethylamine, because these amines have low boiling points and are readily commercially available. Monomethylamine has a boiling point $-6.3°$ C., dimethylamine a boiling point $7.4°$ C., and trimethylamine a boiling point $2.9°$ C. Of these amines, trimethylamine is preferred for the reasons provided above.

The amine vapor is formed from an amine source 104, comprising an amine gas or amine liquid. When amine liquid is used, the amine source 104 comprises a boiler or bubbler fluidly connected to the vacuum chamber 52 by the feed line 102. The boiler or bubbler is maintained at a sufficiently high temperature and sufficiently low pressure to vaporize at least a portion of the liquid amine. Preferably, the boiler or bubbler is maintained at room temperature. The pressure in the boiler is preferably from about 50 Torr to about 200 Torr, and more preferably from about 100 Torr to about 150 Torr. When a boiler is used, the boiler is maintained at a temperature substantially equal to the boiling point of the liquid amine to form amine vapor. When a bubbler is used, a carrier gas, such as argon or helium, bubbled through the bubbler transports the amine vapor to the vacuum chamber 52.

Wet Chemical Etching

After the stripping, passivating, and optional amine inhibition process steps, the passivate and stripped substrate 20 is removed from the chamber and etched in an etchant solution to remove the sidewall deposit 27 that forms during the etch process. Conventional wet chemical etchant solutions are suitable. In this process, the wafers were chemically etched either in an "ACT" 900 series amine-based liquid etchant, commercially available from Advanced Chemical Technologies, Allentown, N.J., or in a HF-containing wet chemical etchant. After wet etching, the wafer was rinsed in deionized water to remove residual wet etchant.

EXAMPLES

The following examples illustrate multicycle and single cycle passivating and stripping processes. Generally, the multicycle processes provided substrates having optimal corrosion resistance.

All of the examples were performed in an "AMAT PRECISION 5000 METAL ETCHER" system, commercially available from Applied Materials, Santa Clara, Calif.. The "PRECISION 5000" apparatus had an etching chamber (not shown) connected to the passivating and stripping chamber (as shown), so that the substrate can be transferred from the etching chamber to the passivating and stripping chamber without exposure to the atmosphere. The etch chamber of the apparatus (not shown) also comprised an inductive coil encircling the chamber for optionally generating a magnetic field to enhance the intensity of the plasma in the chamber. The experiments were performed on silicon wafers having a diameter of about 200 mm (8 inches) and a thickness of 0.73 min.

After passivating and stripping of the substrate, the corrosion resistance of the substrates was tested by exposing the processed substrates to atmosphere or exposing the substrate to elevated moisture levels ranging up to about 40% relative humidity, and after set intervals of time, examining the substrates in an optical microscope under dark field conditions, or in a scanning electron microscope. Corrosion of the substrate was visible as specks of scattered light caused by the corroded hydroscopic species formed on the metal features. The corrosion was measured either directly after the passivating and stripping steps, at intervals of 2 hours to 7 days; or alternatively, after a wet etching step was performed and at intervals of 1, 2, and 3 weeks.

Examples 1–11

In these examples, either single or multicycle passivating and strip processes were performed on substrates having features comprising (i) TiW barrier layer; (ii) an aluminum-silicon-copper conductive metal layer approximately 550 nm thick, the aluminum alloy containing 1.5% silicon and 0.5% copper; and (iii) an antireflective layer of titanium. The substrates previously were etched in an reactive ion etching process using a $BCl_3$, $Cl_2$, and $N_2$ gas mixture.

The process conditions and the results of the corrosion tests for Examples 1–11 are described in Table I. The passivating step was effected using water vapor flowed at a volumetric flow rate of 500 sccm. The stripping step was performed using a stripping gas comprised of oxygen, nitrogen, and optionally water vapor in the described flow rates. In all the processes, the vacuum chamber was maintained at a pressure of 2 Tort. Generally, the multicycle passivating and stripping processes provided superior corrosion results compared to the single cycle processes.

The multicycle passivating and stripping process used for Example 7 provided the best corrosion resistance. In this process, each passivating and stripping step was 20 seconds in duration, and the passivating and stripping steps were repeated three times. Corrosion resistance of greater than 72 to 96 hours was obtained.

Comparison of Examples 6 and 7 suggests that for the same total multicycle process time, an increased number of cycles provide better corrosion resistance.

In comparing Examples 7 and 9, it is observed that a final stripping step substantially increases the corrosion resistance of the substrate. In Example 9, where the final stripping step was not performed, a corrosion resistance of 3 to 7 hours was observed; whereas in Example 7, a corrosion resistance exceeding 72 hours was observed. It is believed that a final stripping step increases corrosion resistance because the oxygen in the stripping gas oxidizes the aluminum in the features, forming a thin protective layer of aluminum oxide on the metal features.

Example 11 demonstrates that the fastest total processing time can be achieved by increasing the number passivating and strip cycles.

TABLE I

| Example | H₂O Passivating Step | | | Stripping Step[1] | | | Cycles (No) | Total Time (Sec) | Hours of Corrosion Resistance (Hours) |
| | RF Power (Watts) | Temp (°C.) | Duration (Sec) | Gas Composition (sccm) | Temp (°) | Duration (Sec) | | | |
|---|---|---|---|---|---|---|---|---|---|
| 1 | None | None | None | O₂:3000 N₂:200 H₂O:300 | 300 | 40 | 1 | 40 | ≦2 |
| 2 | 800 | 250 | 40 | None | None | None | 1 | 40 | ≦2 |
| 3 | 800 | 250 | 90 | None | None | None | 1 | 90 | ≧2 ≦24 |
| 4 | 800 | 250 | 60 | O₂:3000 N₂:200 | 250 | 60 | 1 | 120 | ≦2 |
| 5 | 1400 | 250 | 150 | None | None | None | 1 | 150 | ≦2 |
| 6 | 1400 | 220 | 30 | O₂:3000 N₂:200 | 250 | 30 | 2 | 120 | ≦7 |
| 7 | 1400 | 200 | 20 | O₂:3000 N₂:200 H₂O:300 | 220 | 20 | 3 | 120 | ≧72 to 96[2] |
| 8 | 1400 | 200 | 10 | O₂:3000 N₂:200 H₂O:300 | 220 | 10 | 3 | 60 | ≦2 |
| 9 | 1400 | 200 | 20 | O₂:3000 N₂:200 H₂O:300 | 220 | 20 | 3/2[3] | 100 | ≧3 ≦7 |
| 10 | 1400 | 200 | 20/10 | O₂:3000 N₂:200 H₂O:300 | 220 | 20/10 | 2 | 80 | ≧3 ≦24 |
| 11 | 1400 | 220 | 10 | O₂:3000 N₂:200 H₂O:300 | 220 | 10 | 5 | 100 | ≧72 |

(1) For all stripping steps, the RF power applied to the microwave generator was maintained at 1400 Watts.
(2) Repeatability was demonstrated for this example.
(3) Three passivating cycles + two stripping cycles.

Examples 12–40

In these examples, a multicycle process using (i) a passivating gas comprising 3000 sccm and 300 sccm of ammonia, and (ii) a stripping gas comprising 3000 sccm of oxygen and 300 sccm of nitrogen was used.

The features on the substrates used in these examples comprised sequentially (i) a 3,500 Å, thick layer of aluminum alloy containing 0.5% copper, (ii) a 450 Å layer of TiN, (iii) a 1,000 Å layer of Ti, and (iv) a 365 Å layer of TiN. The wafers were previously etched in a reactive ion etching process that used an etchant gas comprising $BCl_3$, $Cl_2$ and $N_2$, and optionally $CF_4$.

For all the examples, an initial stabilization step of about 10 seconds in duration was performed. In this step, the substrate was transferred to the vacuum chamber. The temperature of the chamber was ramped up from a temperature of about 60° to 100° C. to a temperature of about 325° C., and the pressure of the chamber ramped from a pressure of about 10 to 50 mTorr to a pressure of about 2 Torr. Passivating gas comprising 3000 sccm $O_2$ and 300 sccm $NH_3$ was flowed in the chamber. After the stabilization step, process gas conditions suitable for passivating and stripping the substrates were maintained as described below.

Examples 12–21

Examples 12–21 were processed using an L9 (four process variables with three levels for each variable), orthogonal factorial design experiment. Table II describes the four process variables and the three levels used for each variable.

Table III describes the actual process conditions used to process each of the ten wafers. Example 21 was run at the same process conditions as Example 12 to verify the repeatability of the experiment. In these examples, the first passivating and stripping cycle was performed at a temperature of about 325° C., and the temperature of the second passivating cycle was varied as shown in Table III. In Table III, the variable PS/PT represents the duration in time for a single passivating and strip cycle divided by the total multicycle process time. The variable P/(P+S) represents the total time of a single passivating step divided by the total time for a passivating and strip cycle.

The wafers are inspected under 100× magnification in an optical microscope to examine the photoresist remaining on the wafer immediately after stripping, and to identify corrosion of the wafers after the wafers were exposed to the atmosphere for 6 and 24 hours. No photoresist was seen on any of the wafers, and no signs of corrosion were observed on any of the wafers after the 6 and 24 hour test intervals. These examples demonstrate the low variability in corrosion performance obtained using multicycle passivating and stripping processes.

TABLE II

| Level | Total Process Time (Sec) | Temperature of Second Cycle (°C.) | PS/PT (%) | P/(P + S) (%) |
|---|---|---|---|---|
| 1 | 60 | 380 | 63 | 75 |
| 2 | 50 | 353 | 50 | 63 |
| 3 | 40 | 325 | 38 | 50 |

TABLE III

| Example | Total Process Time (Sec) | Temperature of Second Cycle (°C.) | PS/PT (%) | P/(P + S) (%) |
|---|---|---|---|---|
| 12 | 60 | 380 | 63 | 75 |
| 13 | 60 | 353 | 50 | 63 |
| 14 | 60 | 325 | 38 | 50 |
| 15 | 50 | 380 | 50 | 50 |
| 16 | 50 | 353 | 38 | 75 |
| 17 | 50 | 325 | 63 | 63 |
| 18 | 40 | 380 | 38 | 63 |
| 19 | 40 | 353 | 63 | 50 |
| 20 | 40 | 325 | 50 | 75 |
| 21 | 60 | 380 | 63 | 75 |

Examples 22-31

Examples 22-31 were also processed also using an L9 orthogonal factorial design experiment. The factorial design variables and levels used are listed in Table IV. Table V shows the process conditions used to process each of the Examples 22-31. Example 31 was run at the same process conditions as Example 22 to verify repeatability of the experiment.

After processing, each of the wafers was examined at 100× magnification in an optical microscope. No photoresist was visible on any of the wafers, and none of the examples exhibited any corrosion after 6 and 24 hours, with the exception of Example 30, which exhibited severe corrosion.

These experimental results demonstrate that the corrosion resistance of the substrates is improved with longer passivating and strip process times and higher stripping process temperatures.

TABLE IV

| Level | Total Process Time (Sec) | Temperature of Second Cycle (°C.) | PS/PT (%) | P/(P + S) (%) |
|---|---|---|---|---|
| 1 | 80 | 380 | 63 | 75 |
| 2 | 70 | 353 | 50 | 63 |
| 3 | 60 | 325 | 38 | 50 |

TABLE V

| Example | Total Process Time (Sec) | Temperature of Second Cycle (°C.) | PS/PT (%) | P/(P + S) (%) |
|---|---|---|---|---|
| 22 | 80 | 380 | 63 | 75 |
| 23 | 80 | 353 | 50 | 63 |
| 24 | 80 | 325 | 38 | 50 |
| 25 | 70 | 380 | 50 | 50 |
| 26 | 70 | 353 | 38 | 75 |
| 27 | 70 | 325 | 63 | 63 |
| 28 | 60 | 380 | 38 | 63 |
| 29 | 60 | 353 | 63 | 50 |
| 30 | 60 | 325 | 50 | 75 |
| 31 | 80 | 380 | 63 | 75 |

Examples 32-40

In Examples 32-40, two sets of wafers were processed using multicycle passivating and stripping processes. The first set of wafers were processed to examine the corrosion resistance of the wafers immediately after the stripping and passivating processes. The second set of wafers was processed to examine the corrosion resistance after the stripped and passivated wafers were wet chemical etched.

The first set of wafers used for Examples 32-36 were processed using a two cycle passivating and strip process. The passivating and stripping steps in each cycle were run for about ten seconds, providing a total multiple processing time of 40 seconds. The total processing time for the multiple process, including three second intervals between each passivating and strip step, was 49 seconds. The passivating and stripping steps of the first cycle were both performed at a temperature of 325° C., and the passivating and stripping steps of the second cycle were both performed at a temperature of 380° C.

After processing, the wafers were stored at room temperature in a 40% relative humidity atmosphere. An optical microscope was used to examine residual resist and corrosion on the wafers after set intervals of time. The wafers were examined after one, two, three, four, and seven days; all five of the wafers being examined after the first day, four after the second day, three after the third day, and so on until only one wafer was examined on the seventh day. No corrosion was visible on any of the wafers after these time intervals.

The second set of wafers used for Examples 37-40 were also processed using a two-cycle passivating and stripping process. The duration of each passivating and stripping step in Example 37 was 10 seconds; in Example 38 was 5 seconds; in Example 39 was 3 seconds; and in Example 40 was 2 seconds. The passivating and stripping steps of the first cycle were both performed at a temperature of 325° C., and the passivating and stripping steps of the second cycle were both performed at a temperature of 380° C.

After processing, the wafers were stored at room temperature in a 40% relatively humidity environment. After 24 hours, there was no corrosion visible on any of the wafers.

Thereafter, the wafers were wet chemically etched using an acidic solution containing HF. After etching, the wafers were again stored at room temperature in a 40% relative humidity chamber, and examined under an optical microscope at intervals of one, two, and three weeks. No corrosion was observed on any of the wafers even after three weeks.

Examples 37-40 demonstrated that there was no difference in observed corrosion results between the wafers processed using two second passivating and strip step durations, and the wafers processed using ten second passivating and strip step durations.

Examples 41-53

Examples 41-53 were processed using a single or multiple cycle passivating and strip process. In all of these examples, the passivating gas included water vapor, and optionally oxygen and nitrogen, as described below.

The features on the substrates of Examples 41-53 comprised (i) a 100 nm thick barrier layer of Ti, (ii) either a 1000 nm or a 1050 nm thick conductive layer of Al containing 0.5% Cu, and (iii) either a 36 nm or a 45 nm thick antireflective layer of TiN. The wafers were etched in a reactive ion etching process that used a $BCl_3$, $Cl_2$, and $N_2$ gas mixture, and before etching, the photoresist had a thickness of about 1.8 to 2 microns.

Although both multicycle and single cycle processes were performed on the substrates, some of the single cycle processes, with total process times of 50 seconds, provided adequate corrosion resistance. It is believed that the metal alloys in these features have a sufficiently low galvanic activity that a multicycle process is not needed unless a shorter total process time is desired.

Examples 41–45

In Examples 41–45, a wafer "basket" or hoop was used in the vacuum chamber to hold the substrates. After a substrate was placed in the wafer basket, an initial chamber stabilization step was effected for about 15 seconds. In the stabilization step, process gas was flowed into the vacuum chamber at the flow rates shown in Table VI, and the temperature and pressure of the vacuum zone were maintained at the desired process levels. After stabilization, single cycle passivating and stripping processes, as described in Table VI, were performed. The passivating step of the process had a duration of 20 seconds, and the stripping step a had duration of 40 seconds.

The results of the corrosion tests for Examples 41 through 45 are listed in Table VI. It was observed that the corrosion resistance of the substrates was not effected by a reduction in the passivating temperature (compare Examples 41 and 42 and Examples 43 and 44), or by an increase in stripping temperature (compare Examples 44 and 45).

Example 49 used a two-cycle multicycle passivating and stripping process.

In these examples, a pedestal (not shown) was used to hold the substrate in the vacuum chamber. The pedestal allowed more control over the temperature of the substrate, because the larger mass of the pedestal, as compared to the wafer basket holder, stabilized the temperature of the substrate.

In the passivating step, a process gas comprising 500 sccm $H_2O$, 1000 sccm of $O_2$, and 100 sccm of $N_2$ was used, and the vacuum zone was maintained at a pressure of about 2 Torr. The power level of the microwave generator 86 was maintained at about 1400 Watts.

In the stripping process, a process gas comprising 3500 sccm $O_2$ and 300 sccm of $N_2$ was used, and the vacuum chamber was maintained at a pressure of about 2 Torr. The microwave power level was maintained at about 1000 Watts.

These examples demonstrated that a single cycle water based passivating and stripping process using a substrate temperature ranging from 200° to 300° C. can provide effective corrosion resistance. For features having the described metal-containing layers, a single cycle process having a total duration of at least about 150 seconds provided adequate corrosion resistance, and a multicycle process was not needed. The examples also demonstrated that the order of the passivating and stripping steps did not affect the corrosion resistance of the substrate.

TABLE VI

| | Passivating | | | STRIP | | | |
| --- | --- | --- | --- | --- | --- | --- | --- |
| EXAMPLE | GAS FLOW (SCCM) | TEMP (°C.) | RF POWER (WATTS) | GAS FLOW (SCCM) | TEMP (°C.) | RF POWER (WATTS) | RESULTS |
| 41 | $O_2$:1000 $H_2O$:500 $N_2$:100 | 245 | 1400 | $O_2$:3500 $N_2$:200 | 275 | 400 | no corrosion > 48 hr |
| 42 | $O_2$:1000 $H_2O$:500 $N_2$:100 | 200 | 1000 | $O_2$:3500 $N_2$:200 | 275 | 400 | no corrosion > 48 hr |
| 43 | $H_2O$:500 | 200 | 1100 | $O_2$:3500 $N_2$:200 | 275 | 400 | no corrosion > 48 hr |
| 44 | $H_2O$:500 | 245 | 1400 | $O_2$:3500 $N_2$:200 | 275 | 400 | no corrosion > 48 hr |
| 45 | $H_2O$:500 | 200 | 1100 | $O_2$:3500 $N_2$:200 | 325 | 500 | no corrosion > 48 hr |

Examples 46–52

In Examples 46–52, the process conditions for the passivating and stripping steps were maintained constant, and the duration of the passivating and stripping steps were varied, as shown in Tables VII and VIII. In Examples 46–50, the passivating step preceded the strip step, and in Examples 51 and 52, the stripping step preceded the passivating step.

TABLE VII

| | TIME (SECS) | | | | |
| --- | --- | --- | --- | --- | --- |
| EXAMPLE | STABILIZATION | Passivating | STRIP | TEMP (°C.) | RESULTS |
| 46 | 10 | 30 | 50 | 250 | no corrosion > 24 hr |
| 47 | 10 | 20 | 40 | 300 | no corrosion > 24 hr |
| 48 | 10 | 30 | 30 | 300 | very light corrosion after 24 hr |
| 49 | 10 | 15[1] 15[1] | 10[1] 20[1] | 300 | no corrosion > 24 hr |
| 50 | 5 | 15 | 30 | 300 | complete resist removal; no corrosion > 24 hr |

Note 1: These wafers were processed using a two-cycle process. The passivating steps both had a duration of 15 seconds, and the stripping steps were either 10 or 20 seconds in duration.

TABLE VIII

| EXAMPLE | TIME (SECS) | | | TEMP (°C.) | RESULTS |
| --- | --- | --- | --- | --- | --- |
| | STABILIZATION | STRIP | Passivating | | |
| 51 | 5 | 30 | 50 | 250 | remaining resist, and light corrosion > 24 hr |
| 52 | 5 | 20 | 40 | 300 | no corrosion > 24 hr |

Example 53

Example 53 illustrates a preferred single cycle stripping and passivating process, the process conditions of which are disclosed in Table IX. This process is advantageous because it provides a reasonably high wafer throughput rate while maintaining effective passivating and stripping quality. The wafer passivated using this process demonstrated corrosion resistance over 24 hours when exposed to the atmosphere.

TABLE IX

| ITEM | STABILIZATION | Passivating | STRIP |
| --- | --- | --- | --- |
| $O_2$ (sccm) | 0 | 0 | 3500 |
| $N_2$ (sccm) | 0 | 0 | 300 |
| $H_2O$ (sccm) | 500 | 500 | 0 |
| Temperature (°C.) | 250 | 250 | 250 |
| Pressure (Torr) | 2 | 2 | 2 |
| Power (W) | | | |
| Basket | 0 | 1400 | 500 |
| Pedestal | 0 | 1400 | 1000 |
| Time (sec) | | | |
| Basket | 15 | 20 | 40 |
| Pedestal | 5 | 20 | 40 |

Examples 54 and 55

These examples illustrate that a single cycle water vapor passivating process can be used to prevent corrosion of a highly corrosive, partially etched Ti-W layer on a substrate. In these examples, a complete reactive ion etching, passivating and stripping process sequence is described. The wafers used in these examples had features comprising (i) a barrier layer of Ti-W alloy, (ii) a conductive layer of an aluminum containing alloy, and (iii) a antireflective layer. The features on the wafers were etched through until the lower Ti-W barrier layer was exposed. The Ti-W layer was not etched through, because the underlying circuit devices can be damaged by the plasma etching process. The partially etched Ti-W barrier layer rapidly corrodes when exposed to the atmosphere, because the galvanic coupling of the metals in the alloy promotes corrosion. Thus, immediately after etching, the partially etched barrier layer was passivated using a water vapor containing plasma.

The substrates of Examples 54 and 55 were etched in an etching chamber (not shown) using a two-stage etching process. In the first etching stage, etchant gas comprising $BCl_3$ at a flow rate of about 50 sccm, $Cl_2$ at a flow rate of 40 sccm, and $N_2$ at a flow rate of 20 sccm, was introduced into the etching chamber. The pressure in the chamber was maintained at about 200 mTorr. The RF power applied to the cathode in the chamber was maintained at about 400 Watts, and a 40 gauss magnetic field was generated using the inductive coils to enhance the plasma. The first etching stage was effected until the aluminum containing layer on the substrates was etched through, the end point of the etching step measured by optical emission techniques. In the second etching stage, the 1500 Å thick Ti-W barrier layer on the substrate was etched until 500 Å, of the Ti-W layer was etched through, and 1000 Å of the Ti-W layer remained on the substrates. In the second etching stage, a process gas comprising 25 sccm of $BCl_3$, 20 sccm of $Cl_2$, and 20 sccm of $N_2$, was introduced into the chamber, and the chamber was maintained at a pressure of about 20 mTorr. The RF power applied to the cathode was maintained at a level of 250 Watts, and a 40 gauss magnetic field used to enhance the plasma in the chamber. The second etching stage was affected for about 40 seconds.

After etching, the wafer was transferred from the etching chamber (not shown) to the passivating and stripping chamber. In Example 54, the wafer was passivated and stripped in separate steps. In the passivating step, water vapor was introduced into the chamber at a flow rate of 500 sccm. An 800 Watt RF power was applied to the microwave plasma generator and the wafer was heated to 250° C. The passivating process was effected for a total time of 45 seconds. After passivating, the wafer was stripped in a separate stripping step. The stripping step used a stripping gas comprising oxygen at a flow of 300 sccm and nitrogen at a flow of 200 to 300 sccm. A 1400 Watt RF power level was maintained at the microwave generator, and the temperature of the wafer maintained at 250° C. In both the passivating and stripping steps, the pressure in the chamber was maintained at 2 Torr. The passivated wafer of Example 54 was substantially corrosion resistant when exposed to the atmosphere.

The wafer of Example 55 was passivated and stripped in a single step process. Process gas comprising oxygen at a flow of 3000 sccm, nitrogen at a flow of 200 sccm, and water vapor at a flow of 300 sccm was introduced into the chamber. A plasma at a power level of 1400 Watts was generated for about 90 seconds to strip and passivate the wafer. The passivated wafer of Example 55, was also observed to be resistant to corrosion under atmospheric conditions. After stripping and passivating, the remaining 1000 Å, thickness of barrier layer on the passivated wafer, was removed using a wet chemical etching process. In addition to this process, the wafer was chemically etched in "ACT" 900 series liquid etchants, commercially available from Advanced Chemical Technologies, Allentown, N.J., to remove sidewall deposition. After etching, the wafer was rinsed in deionized water to remove residual etchant.

The present invention has been described in considerable detail with reference to certain preferred versions thereof, however, other versions are possible. For example, the multicycle process can be performed using passivating and stripping gas processes other than those disclosed herein. Also, the single cycle water vapor based passivating and stripping processes can be combined with other passivating and stripping processes, to provide greater corrosion resistance and process efficiency. Therefore the spirit and scope of the appended claims should not be limited to the description of the preferred versions contained herein.

What is claimed is:

1. A process for passivating a substrate having etchant byproducts thereon, the process comprising the steps of:
   (a) placing the substrate into a vacuum chamber;
   (b) introducing a passivating gas into the vacuum chamber and forming a plasma from the passivating gas;
   (c) stopping the flow of passivating gas and extinguishing the plasma;
   (d) repeating step (b) and (c) at least once to passivate the etchant byproducts on the substrate; and
   (e) removing the passivated substrate from the chamber.

2. The process of claim 1, wherein step (d) is performed for a sufficient number of cycles that when the substrate is exposed to the atmosphere there is substantially no corrosion of the substrate for at least 24 hours.

3. The process of claim 1, wherein the substrate has features with sidewall deposits thereon, and wherein the sidewall deposits are etched using an etchant solution, and wherein after etching with the etchant solution, there is substantially no corrosion of the substrate for at least 1 week when the substrate is exposed to the atmosphere.

4. The process of claim 1, wherein step (d) is performed for 1 to 10 cycles.

5. The process of claim 4, where in step (d) is performed for 2 to 5 cycles.

6. The process of claim 1, wherein the duration of the entire passivating process is from about 30 seconds to about 180 seconds.

7. The process of claim 1, wherein step (b) has a duration of about 1 to about 60 seconds.

8. The process of claim 7, wherein step (b) has a duration of about 2 to about 20 seconds.

9. The process of claim 1, wherein after introducing passivating gas into the chamber, the chamber is maintained at a first higher pressure, and wherein after stopping the flow of passivating gas, the chamber is maintained at a second lower pressure.

10. The process of the claim 9, wherein the first higher pressure is at least about 1 Torr, and the second lower pressure is less than about 500 mTorr.

11. The process of claim 1, wherein the passivating gas is selected from the group comprising water vapor, ammonia, hydrogen, oxygen and nitrogen.

12. The process of claim 11, wherein the passivating gas comprises water vapor, oxygen and nitrogen, the ratio of the volumetric flow of water vapor to the combined volumetric flow of oxygen and nitrogen ranging from about 1:2 to about 2:1.

13. The process of claim 1, wherein the substrate has remnant resist thereon, and wherein either before step (b) or after step (c), the remnant resist on the substrate is stripped by introducing a stripping gas into the vacuum chamber and forming a plasma from the stripping gas.

14. The process of claim 13, wherein the passivating and stripping gases are selected from the group consisting of oxygen, nitrogen, fluorocarbon, water vapor, ammonia, hydrogen, and mixtures thereof.

15. The process of claim 13, wherein the stripping gas comprises oxygen and an oxygen activating gas, the oxygen activating gas being selected from the group consisting of fluorocarbon and nitrogen gas.

16. The process of claim 13, wherein the passivating and stripping gases comprise water vapor, oxygen and nitrogen.

17. The process of claim 16, wherein the ratio of the volumetric flow of water vapor to the combined volumetric flow of oxygen and nitrogen is from about 1:4 to about 1:40.

18. The process of claim 1, wherein the vacuum chamber is maintained at a temperature of from about 150° C. to about 400° C.

19. The process of claim 1, wherein the vacuum chamber is maintained at a pressure of from about 1 Torr to about 100 Torr.

20. The process of claim 1, wherein the plasma is formed by a microwave generator with an output power level ranging from about 500 to about 2500 Watts.

21. The process of claim 1, wherein the substrate comprises a silicon wafer having etched metal-containing features thereon.

22. The process of claim 1, wherein before step (e), corrosion of the substrate is inhibited by introducing an amine vapor into the vacuum chamber for adsorbing the amine vapor onto the substrate, the adsorbed amine substantially inhibiting corrosion of the substrate when the substrate is exposed to the atmosphere, and wherein the amine vapor comprises $(R_x)_3$—N, where at least one $R_x$ is an alkyl moiety and the other $R_x$ are independently selected from the group consisting of hydrogen and alkyl moieties, and wherein the vapor pressure of the amine is sufficiently high that at least a portion of the amine is gaseous in the vacuum chamber and sufficiently low that at least a portion of the amine is adsorbed onto the substrate.

23. A process for stripping and passivating a substrate having etchant byproducts thereon, the process comprising the steps of:
   (a) placing a substrate into a vacuum chamber;
   (b) introducing passivating gas into the vacuum chamber, forming a plasma from the passivating gas, and maintaining the chamber at a first higher pressure;
   (c) stopping the flow of passivating gas, extinguishing the plasma, and maintaining the chamber at a second lower pressure;
   (d) repeating steps (b) and (c) at least once to passivate the etchant byproduct on the substrate; and
   (e) removing the passivated substrate from the chamber.

24. The process of claim 23, wherein step (d) is performed for a sufficient number of cycles that when the substrate is exposed to the atmosphere there is substantially no corrosion of the substrate for at least 24 hours.

25. The process of claim 23, wherein the substrate has features with sidewall deposits thereon, and wherein the sidewall deposits are etched using an etchant solution, and wherein after etching with the etchant solution, there is substantially no corrosion of the substrate for at least 1 week when the substrate is exposed to the atmosphere.

26. The process of claim 23, wherein step (d) is performed for 1 to 10 cycles.

27. The process of claim 23, wherein the duration of the entire passivating process is from about 30 seconds to about 180 seconds.

28. The process of the claim 23, wherein the first higher pressure is at least about 1 Torr, and the second lower pressure is less than about 500 mTorr.

29. The process of claim 23, wherein the passivating gas is selected from the group comprising of water vapor, ammonia, hydrogen, oxygen and nitrogen.

30. A process for stripping and passivating a substrate with remnant resist and etchant byproducts thereon, the process comprising the steps of:
   (a) placing the substrate into a vacuum chamber;
   (b) passivating etchant byproducts on the substrate by introducing a passivating gas into the vacuum chamber and forming a plasma from the passivating gas;

(c) before or after step (b), stripping resist from the substrate by introducing a stripping gas into the vacuum chamber and forming a plasma from the stripping gas;

(d) repeating steps (b) and (c) at least once in the same order that steps (b) and (c) were done; and (e) removing the passivated and stripped substrate from the chamber.

31. The process of claim 30, wherein the stripping and passivating steps are performed for a sufficient number of cycles that when the substrate is exposed to the atmosphere there is substantially no corrosion of the substrate for at least 24 hours.

32. The process of claim 30, wherein the substrate has features with sidewall deposits thereon, and wherein the sidewall deposits are etched using an etchant solution, and wherein after etching with the etchant solution, there is substantially no corrosion of the substrate for at least 1 week when the substrate is exposed to the atmosphere.

33. The process of claim 30, wherein the stripping and passivating steps are performed for 1 to 10 cycles.

34. The process of claim 33, wherein the stripping and passivating steps are performed for 2 to 5 cycles.

35. The process of claim 30, wherein the duration of the entire stripping and passivating process is from about 30 seconds to about 180 seconds.

36. The process of claim 30, wherein the passivating step (b) and the stripping step (c) each have a duration of about 1 to about 60 seconds.

37. The process of claim 30, wherein the passivating and stripping gases are selected from the group consisting of oxygen, nitrogen, fluorocarbon, water vapor, ammonia, hydrogen, and mixtures thereof.

38. The process of claim 37, wherein the passivating and stripping gases comprise water vapor, oxygen and nitrogen.

39. The process of claim 38, wherein the ratio of the volumetric flow of water vapor to the combined volumetric flow of oxygen and nitrogen is from about 1:2 to about 2:1.

40. The process of claim 38, wherein the ratio of the volumetric flow water vapor to the combined volumetric flow of oxygen and nitrogen is from about 1:4 to about 1:40.

41. The process of claim 30, wherein the stripping gas comprises oxygen and an oxygen activating gas, the oxygen activating gas being selected from the group consisting of chlorofluorocarbons, water vapor and nitrogen.

42. The process of claim 30, wherein during the passivating and stripping steps, the vacuum chamber is maintained at a temperature within the range of from about 150° C. to about 400° C.

43. The process of claim 30, wherein the vacuum chamber is maintained at substantially the same temperature in both the passivating and stripping steps.

44. The process of claim 30, wherein the vacuum chamber is maintained at different temperatures during the passivating and stripping steps.

45. The process of claim 30, wherein during the passivating and stripping steps, the vacuum chamber is maintained at a pressure of from about 1 Torr to about 100 Torr.

46. The process of claim 30, wherein during the passivating and stripping steps, the plasma is formed by applying an RF current having a power level of about 500 Watts to about 2500 Watts to a microwave generator.

47. The process of claim 30, wherein the substrate comprises a silicon wafer having etched metal-containing features thereon.

48. The process of claim 30, wherein before step (e), corrosion of the substrate is inhibited by introducing an amine vapor into the vacuum chamber for adsorping the amine vapor onto the substrate, the adsorbed amine substantially inhibiting corrosion of the substrate when the substrate is exposed to the atmosphere, wherein the amine comprises $(R_x)_3$—N, where at least one $R_x$ is an alkyl moiety and the other $R_x$ are independently selected from the group consisting of hydrogen and alkyl moieties, and wherein the vapor pressure of the amine is sufficiently high that at least a portion of the amine is gaseous in the vacuum chamber and sufficiently low that at least a portion of the amine is adsorbed onto the substrate.

49. A process for passivating a substrate with etchant byproducts thereon, the process comprising the steps of:

(a) placing the substrate into a vacuum chamber;

(b) introducing a process gas into the vacuum chamber, the process gas comprising water vapor, oxygen and nitrogen, the ratio of the volumetric flow of water vapor to the combined volumetric flow of oxygen and nitrogen ranging from about 1:2 to about 2:1; and (c) forming a plasma from the process gas for a sufficient time to passivate the etchant byproducts on the substrate.

50. The process of claim 49, wherein the vacuum chamber is maintained at a pressure ranging from about 1 to about 10 Torr.

51. The process of claim 49, wherein the vacuum chamber is maintained at a temperature ranging from about 150° C. to about 400° C.

52. A process for simultaneously stripping and passivating a substrate with remnant resist and etchant byproducts thereon, the process comprising the steps of:

(a) placing the substrate into a vacuum chamber;

(b) introducing a process gas into the vacuum chamber, the process gas comprising water vapor, oxygen and nitrogen, the ratio of the volumetric flow of water vapor to the combined volumetric flow of oxygen and nitrogen ranging from about 1:4 to about 1:40; and (c) forming a plasma from the process gas to passivate the etchant byproducts, and strip the remnant resist, on the substrate.

53. The process of claim 52, wherein the vacuum chamber is maintained at a pressure ranging from about 1 to about 10 Torr.

54. The process of claim 52, wherein the vacuum chamber is maintained at a temperature ranging from about 150° to about 400° C.

55. A process for inhibiting corrosion of a substrate having etchant byproducts thereon, comprising the steps of:

(a) placing the substrate into a vacuum chamber;

(b) forming an amine vapor; and (c) introducing the amine vapor into the vacuum chamber for adsorping the amine vapor onto the substrate, the adsorbed amine substantially inhibiting corrosion of the substrate when the substrate is exposed to the atmosphere, wherein the amine comprises $(R_x)_3$—N, where at least one $R_x$ is an alkyl moiety and the other $R_x$ are independently selected from the group consisting of hydrogen and alkyl moieties, and wherein the vapor pressure of the amine is sufficiently high that at least a portion of the amine is gaseous in the vacuum chamber and sufficiently low that at least a portion of the amine is adsorbed onto the substrate.

56. The process of claim 55, wherein the vacuum chamber is maintained at a temperature ranging from about 150° C. to about 400° C.

57. The process of claim 55, wherein the vacuum chamber is maintained at pressure ranging from about 1 Torr to about 10 Torr.

58. The process of claim 55, wherein sufficient amine is adsorbed onto the substrate that corrosion of the substrate is inhibited for at least about 24 hours.

59. The process of claim 55, wherein the amine vapor is introduced into the vacuum chamber for less than about 120 seconds.

60. The process of claim 55, wherein the amine comprises two alkyl moieties, each alkyl moiety comprising from 1 to 5 carbon atoms.

61. The process of claim 55, wherein the amine comprises three alkyl moieties.

62. The process of claim 55, wherein the amine is selected from the group consisting of monomethylamine, dimethylamine and trimethylamine.

63. The process of claim 55, wherein in step (b), the amine vapor is formed by maintaining an amine vapor source at room temperature and at a pressure ranging from about 50 Torr to about 200 Torr.

64. The process of claim 55, wherein the amine vapor is maintained at a pressure ranging from about 100 Torr to about 150 Torr.

65. A process for stripping and passivating a substrate with remnant resist and etchant byproducts thereon, the process comprising the steps of:

(a) placing the substrate into a vacuum chamber maintained at a pressure of about 1 Torr to about 100 Torr;

(b) passivating etchant byproducts on the substrate by introducing a passivating gas into the vacuum chamber and forming a plasma from the passivating gas;

(c) before or after step (b), stripping resist from the substrate by introducing a stripping gas into the vacuum chamber and forming a plasma from the stripping gas;

(d) repeating steps (b) and (c) at least once in the same order that steps (b) and (c) were done; and (e) inhibiting corrosion of the substrate by introducing amine vapor into the vacuum chamber for adsorping the amine vapor onto the substrate, the adsorbed amine substantially inhibiting corrosion of the substrate when the substrate is exposed to the atmosphere, wherein the amine comprises $(R_x)_3$—N, where at least one $R_x$ is an alkyl moiety and the other $R_x$ are independently selected from the group consisting of hydrogen and alkyl moieties, and wherein the vapor pressure of the amine is sufficiently high that at least a portion of the amine is gaseous in the vacuum chamber and is sufficiently low that at least a portion of the amine is adsorbed onto the substrate.

66. A process for stripping, passivating, and inhibiting corrosion of a substrate with remnant resist and etchant byproducts on a substrate, the process comprising the steps of:

(a) placing the substrate into a vacuum chamber at pressure ranging from about 1 Torr to about 100 Torr;

(b) simultaneously passivating etchant byproducts and stripping remnant resist on the substrate by (i) introducing a process gas into the vacuum chamber, the process gas comprising water vapor, oxygen and nitrogen, the ratio of the volumetric flow of the water vapor to the combined volumetric flow of oxygen and nitrogen ranging from about 1:4 to about 1:40, and (ii) forming a plasma from the process gas;

(c) inhibiting corrosion of the substrate by introducing amine vapor into the vacuum chamber for adsorbing amine onto the substrate, the adsorbed amine substantially inhibiting corrosion of the substrate when the substrate is exposed to the atmosphere, wherein the amine comprises $(R_x)_3$—N, where at least one $R_x$ is an alkyl moiety and the other $R_x$ are independently selected from the group consisting of hydrogen and alkyl moieties, and wherein the vapor pressure of the amine is sufficiently high that at least a portion of the amine is gaseous in the vacuum chamber and is sufficiently low that at least a portion of the amine is adsorbed onto the substrate.

67. A process for stripping, passivating, and inhibiting corrosion of a substrate with remnant resist and etchant byproducts thereon, the process comprising the steps of:

(a) placing the substrate into a vacuum chamber at pressure ranging from about 1 Torr to about 100 Torr;

(b) passivating etchant byproduct on the substrate by introducing a process gas into the vacuum chamber and forming a plasma from the process gas, the process gas comprising water vapor, oxygen and nitrogen, the ratio of the volumetric flow of water vapor to the combined volumetric flow of oxygen and nitrogen ranging from about 1:2 to about 2:1;

(c) stripping remnant resist from the substrate by introducing a stripping gas into the vacuum chamber and forming a plasma from the stripping gas; and (d) inhibiting corrosion of the substrate by introducing amine vapor into the vacuum chamber for adsorping amine onto the substrate, the adsorbed amine substantially inhibiting corrosion of the substrate when the substrate is exposed to the atmosphere, wherein the amine comprises $(R_x)_3$—N, where at least one $R_x$ is an alkyl moiety and the other $R_x$ are independently selected from the group consisting of hydrogen and alkyl moieties, and wherein the vapor pressure of the amine is sufficiently high that at least a portion of the amine is gaseous in the vacuum chamber and is sufficiently low that at least a portion of the amine is adsorbed onto the substrate.

68. A corrosion resistant substrate formed by the process of claim 1.

69. A corrosion resistant substrate formed by the process of claim 23.

70. A corrosion resistant substrate formed by the process of claim 30.

71. A corrosion resistant substrate formed by the process of claim 49.

72. A corrosion resistant substrate formed by the process of claim 52.

73. A corrosion resistant substrate formed by the process of claim 55.

74. The process of claim 65, wherein step (d) is performed for a sufficient number of cycles that when the substrate is exposed to the atmosphere there is substantially no corrosion of the substrate for at least 24 hours.

75. The process of claim 65, wherein step (d) is performed for 1 to 10 cycles.

76. The process of claim 65, wherein the duration of the entire process is from about 30 seconds to about 180 seconds.

77. The process of claim 65, wherein steps (b) and (c) each have a duration of about 1 to about 60 seconds.

78. The process of claim 65, wherein the passivating and stripping gases are selected from the group comprising water vapor, ammonia, hydrogen, oxygen and nitrogen.

79. The process of claim 65, wherein the amine comprises two alkyl moieties, each alkyl moiety comprising from 1 to 5 carbon atoms.

80. The process of claim 65, wherein the amine is selected from the group consisting of monomethylamine, dimethylamine and trimethylamine.

81. The process of claim 66, wherein the duration of the entire process is from about 30 seconds to about 180 seconds.

82. The process of claim 66, wherein step (b) has a duration of about 1 to about 60 seconds.

83. The process of claim 66, wherein the amine comprises two alkyl moieties, each alkyl moiety comprising from 1 to 5 carbon atoms.

84. The process of claim 66, wherein the amine is selected from the group consisting of monomethylamine, dimethylamine and trimethylamine.

85. The process of claim 67, wherein the duration of the entire process is from about 30 seconds to about 180 seconds.

86. The process of claim 67, wherein step (b) has a duration of about 1 to about 60 seconds.

87. The process of claim 67, wherein the amine comprises two alkyl moieties, each alkyl moiety comprising from 1 to 5 carbon atoms.

88. The process of claim 67, wherein the amine is selected from the group consisting of monomethylamine, dimethylamine and trimethylamine.

89. A corrosion resistant substrate formed by the process of claim 65.

90. A corrosion resistant substrate formed by the process of claim 66.

91. A corrosion resistant substrate formed by the process of claim 67.

* * * * *

UNITED STATES PATENT AND TRADEMARK OFFICE
CERTIFICATE OF CORRECTION

PATENT NO. : 5,545,289
DATED : August 13, 1996
INVENTOR(S) : Chen, et al.

It is certified that error appears in the above-indentified patent and that said Letters Patent is hereby corrected as shown below:

On the title page, item:

[73] Assignee: Applied Materials, Inc.,
Santa Clara, California

Intel Corporation,
Santa Clara, California

Signed and Sealed this

Fourteenth Day of July, 1998

Attest:

BRUCE LEHMAN

Attesting Officer

Commissioner of Patents and Trademarks